United States Patent
Horio et al.

(10) Patent No.: US 7,737,369 B2
(45) Date of Patent: Jun. 15, 2010

(54) SEMICONDUCTOR MODULE (75) Inventors: Tomoharu Horio, Kyoto (JP); Nobuo Asada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 968 days.

(21) Appl. No.: 10/584,336

(22) PCT Filed: Dec. 20, 2004

(86) PCT No.: PCT/JP2004/019020

§ 371 (c)(1),
(2), (4) Date: Jun. 23, 2006

(87) PCT Pub. No.: WO2005/064688

PCT Pub. Date: Jul. 14, 2005

(65) Prior Publication Data

US 2008/0315215 A1 Dec. 25, 2008

(30) Foreign Application Priority Data

Dec. 25, 2003 (JP) ............................. 2003-428975

(51) Int. Cl.
*H05K 9/00* (2006.01)
(52) U.S. Cl. .................. 174/354; 174/377; 257/98; 257/659
(58) Field of Classification Search ............... 174/354, 174/363, 377; 257/433, 434, 659, 660, 98, 257/680; 361/816, 818
See application file for complete search history.

(56) References Cited

U.S. PATENT DOCUMENTS

| | | | | |
|---|---|---|---|---|
| 5,118,924 A | * | 6/1992 | Mehra et al. | 257/659 |
| 5,355,016 A | * | 10/1994 | Swirbel et al. | 257/659 |
| 5,406,117 A | * | 4/1995 | Dlugokecki et al. | 257/659 |
| 5,485,037 A | * | 1/1996 | Marrs | 257/712 |
| 5,557,142 A | * | 9/1996 | Gilmore et al. | 257/659 |
| 5,559,306 A | * | 9/1996 | Mahulikar | 174/538 |
| 5,594,204 A | * | 1/1997 | Taylor et al. | 174/527 |
| 5,679,975 A | * | 10/1997 | Wyland et al. | 257/659 |
| 5,825,042 A | * | 10/1998 | Strobel et al. | 250/515.1 |
| 6,590,152 B1 | | 7/2003 | Horio et al. | |
| 2002/0094177 A1 | | 7/2002 | Horio | |

FOREIGN PATENT DOCUMENTS

| | | |
|---|---|---|
| JP | 8-167724 | 6/1996 |
| JP | 11-126913 | 5/1999 |
| JP | 2001-68722 | 3/2001 |
| JP | 2001-135859 | 5/2001 |
| JP | 2002-76427 | 3/2002 |
| JP | 2002-185022 | 6/2002 |

* cited by examiner

Primary Examiner—Hung V Ngo
(74) Attorney, Agent, or Firm—Hamre, Schumann, Mueller & Larson, P.C.

(57) ABSTRACT

A semiconductor module (A1) comprises a semiconductor device (10) provided with a semiconductor chip, and a conductive cover (6) for electromagnetic shielding bonded to the semiconductor device (10) via an adhesive coat (8). The conductive cover (6) includes a surface facing the adhesive coat (8), and the surface is formed with a convex portion (6a) protruding toward the adhesive coat (8). Around the convex portion (6a), a space (7) is formed for filling in adhesive to form the adhesive coat (8).

6 Claims, 7 Drawing Sheets

SEMICONDUCTOR MODULE

TECHNICAL FIELD

The present invention relates to an infrared communication module to be incorporated in a remote controller of an electrical appliance, a personal computer, or a mobile phone, or relates to some other kinds of semiconductor modules.

BACKGROUND ART

An example of semiconductor device includes an infrared communication module. (Refer to JP-A-2001-135859, for example.)

Figure 10:
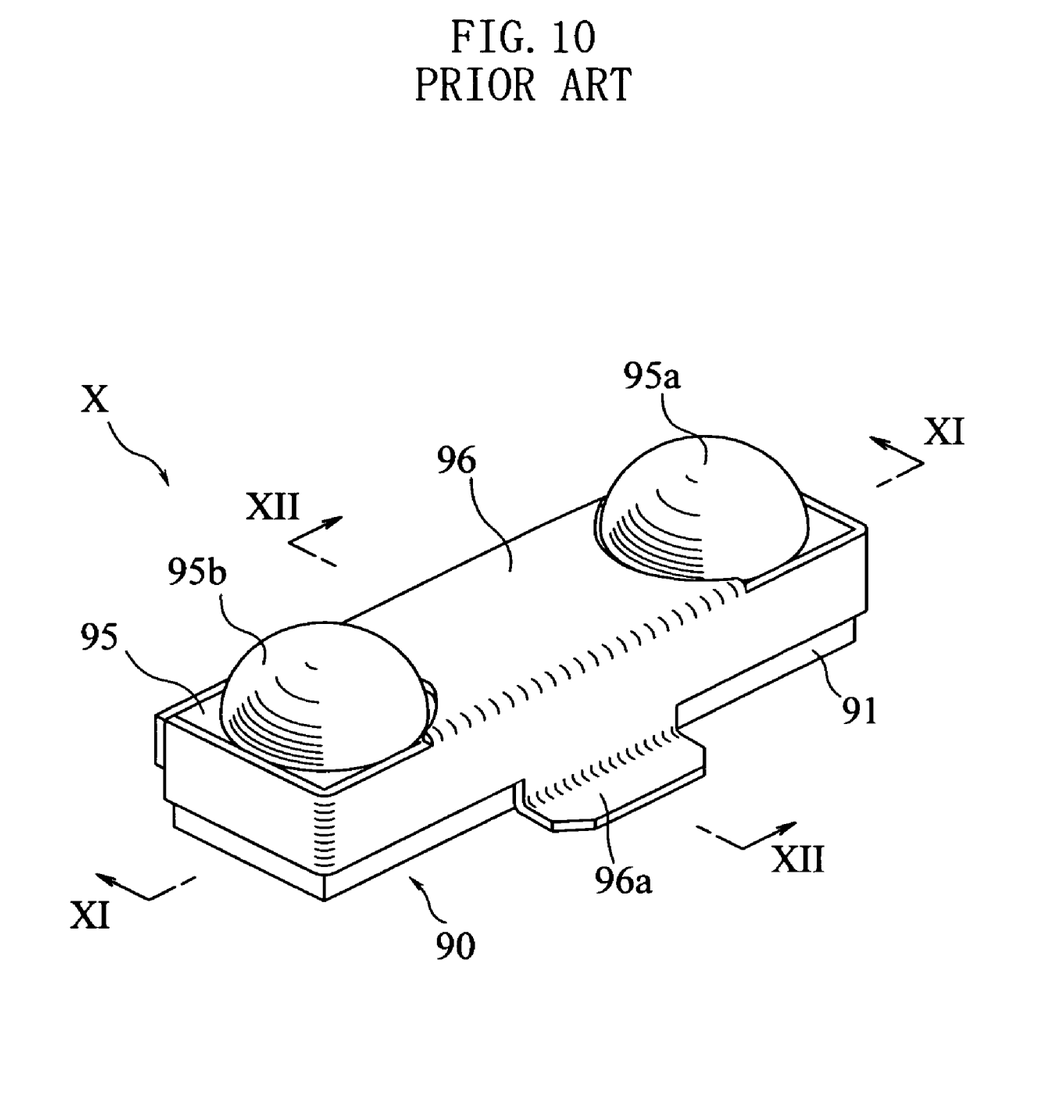
FIG. 10 is an overall perspective view illustrating a conventional infrared communication module.
Figure 11:
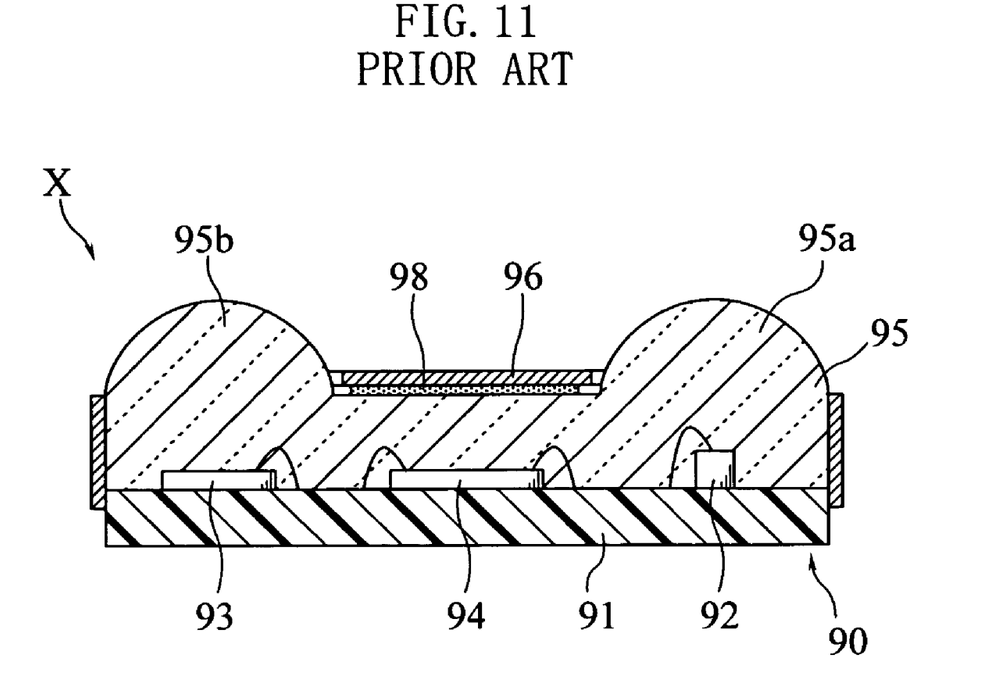
FIG. 11 is a sectional view taken along lines XI-XI of FIG. 10.
Figure 12:
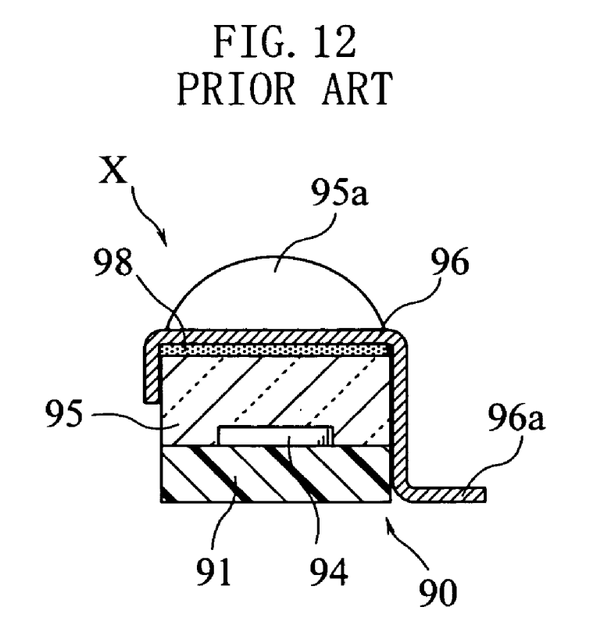
FIG. 12 is a vertical sectional view taken along lines XII-XII of FIG. 10.

FIGS. 10-12 illustrate an example of a conventional infrared communication module. FIG. 10 is a perspective view of the infrared communication module, FIG. 11 is a sectional view taken along lines XI-XI of FIG. 12, and FIG. 12 is a sectional view taken along lines XII-XII of FIG. 12.

The infrared communication module X includes a semiconductor device 90 and a conductive cover 96. The semiconductor device 90 includes a base board 91, an LED 92, a photodiode 93, and an IC chip 94, and is capable of transmitting and receiving infrared rays.

The LED 92 emits infrared rays to outside, while the photodiode 93 receives infrared rays entering from outside. The LED 92, the photodiode 93, and the IC chip 94 provided on the base board 91 are protected by a sealing resin 95. The sealing resin 95 is provided with lenses 95a, 95b above the LED 92 and the photodiode 93, respectively. The lens 95a improves directivity of infrared rays emitted from the LED 92, while the lens 95b collects infrared rays entering from outside onto the photodiode 93.

The infrared ray generated by the LED 92 is emitted upward with directivity enhanced by the lens 95a formed at sealing resin 95, whereas the infrared ray entering the lens 95b is collected onto the light receiving surface of the photodiode 93.

The conductive cover 96 is a rectangular parallelepiped having a short height. The conductive cover 96 is open at its bottom and at portions of its top corresponding to the lenses 95a, 95b. The conductive cover 96 is folded back to form a terminal 96a protruding outwardly, at the bottom around the intermediate portion of the longitudinal side thereof. The terminal 96a serves to connect the conductive cover 96 to the ground of a wiring board to which the infrared communication module X is mounted. By grounding the conductive cover 96, the LED 92, the photodiode 93, and the IC chip 94 provided on the surface of the base board 91 are shielded to inhibit influence of outside noise.

As well shown in FIG. 11, the under surface of the top of the conductive cover 96 is bonded to the sealing resin 95 at a portion between the lenses 95a, 95b, by an adhesive 98. With the adhesive 98, the conductive cover 96 can be fixed to the semiconductor device 90, easily and firmly.

However, when the conductive cover 96 is fixed to the sealing resin 95 only by the adhesive 98, on bonding the conductive cover 96 to the semiconductor device 90, the top of the conductive cover 96 is pressed so that the adhesive 98 is spread over, and thus may leak out of the bonding portion of the conductive cover 96 to the lens 95a or 95. The adhesive 98 may leak out furthermore when the adhesive 98 is coated by a large amount or when the conductive cover 96 is pressed onto the semiconductor device 90 at a large strength.

If this happens, the infrared communication module X may be defaced, or the communication function of the infrared communication module X may be decreased due to the adhesive 98 leaking and sticking to the lenses 95a, 95b of the sealing resin 95. Specifically, the traveling direction of the infrared rays emitted from the LED 92 may be affected by the defaced lens 95a, or the amount of the infrared rays collected onto the photodiode 93 may be affected by the defaced lens 95b.

Further, the conductive cover 96 tends to be pressed non-uniformly on bonding of the conductive cover 96 to the semiconductor device 90, and thus the adhesive 98 may have a non-uniform thickness, so that the conductive cover 96 may be bonded to the semiconductor device 90 obliquely.

As shown in FIG. 12, the terminal 96a for grounding protrudes at a position substantially same as the position of the bottom of the base plate 90, when the top of the conductive cover 96 is bonded to the sealing resin 95 via a substantially uniform adhesive coat. Thus, if the conductive cover 96 is obliquely bonded to the semiconductor device 90, the position of the terminal 96a may largely deviate away from a proper position due to the obliquity of the conductive cover 96. Such deviation causes improper grounding of the terminal 96a, so that the electromagnetic shielding effect of the conductive cover 96 may not be achieved.

DISCLOSURE OF THE INVENTION

An object of the present invention is to provide a semiconductor module for eliminating or reducing the above problems in the conventional art.

A semiconductor module according to a first aspect of the present invention comprises a semiconductor device provided with a semiconductor chip; and a conductive cover for electromagnetic shielding bonded to the semiconductor device via an adhesive coat. The conductive cover includes a surface facing the adhesive coat, and the surface is formed with a convex portion protruding toward the adhesive coat. Around the convex portion, a space is formed for filling in adhesive to form the adhesive coat.

Preferably, the semiconductor module comprises three or more convex portions arranged nonlinearly.

Preferably, the semiconductor module comprises two or more elongated convex portions having center axes non-collinear to each other.

Preferably, the semiconductor device includes a surface facing the adhesive coat, and the surface is formed with a recess. At least a part of the convex portion is positioned on a portion other than the recess.

Preferably, the conductive cover is made of a metal, and the convex portion is formed by embossing.

Preferably, the semiconductor device includes a light emitting element capable of generating infrared rays, a light receiving element capable of receiving and detecting infrared rays, and an IC chip. The semiconductor module is an infrared communication module capable of transmitting and receiving infrared rays.

A semiconductor module according to a second embodiment of the present invention comprises a semiconductor device provided with a semiconductor chip and a conductive cover for electromagnetic shielding bonded to the semiconductor device via an adhesive coat. The semiconductor device includes a surface facing the adhesive coat, and the surface is formed with a convex portion protruding toward the adhesive coat. Around the convex portion, a space is formed for filling in adhesive to form the adhesive coat.

Other features and advantages will be apparent from the following description of the embodiments.

BEST MODE FOR CARRYING OUT THE INVENTION

Preferred embodiments of the present invention are specifically described below with reference to the accompanying drawings.

Figure 1:
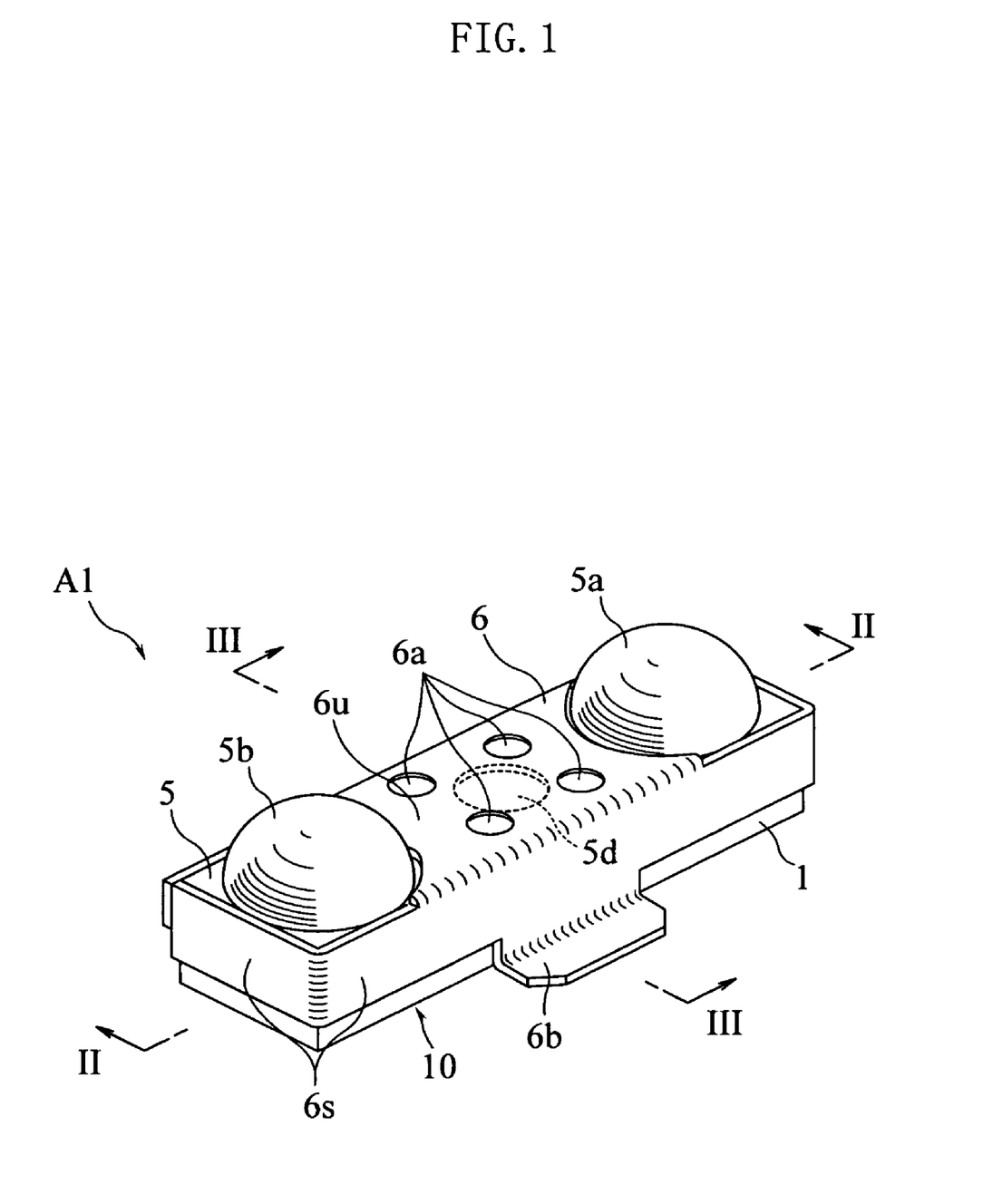
FIG. 1 is an overall perspective view illustrating an infrared communication module according to a first embodiment of the present invention.
Figure 2:
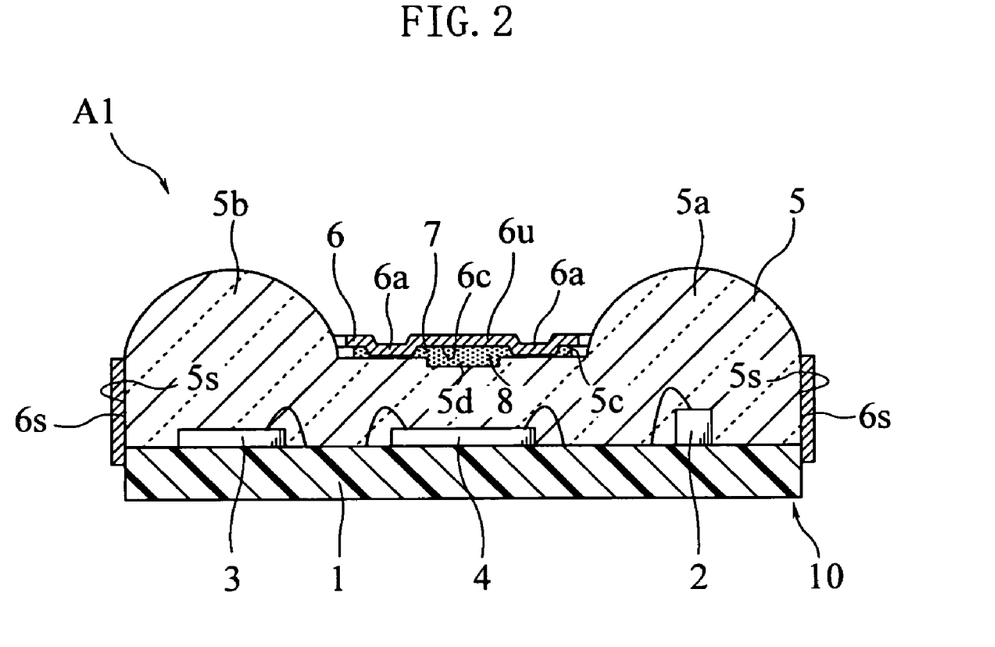
FIG. 2 is a vertical sectional view taken along lines II-II of FIG. 1.
Figure 3:
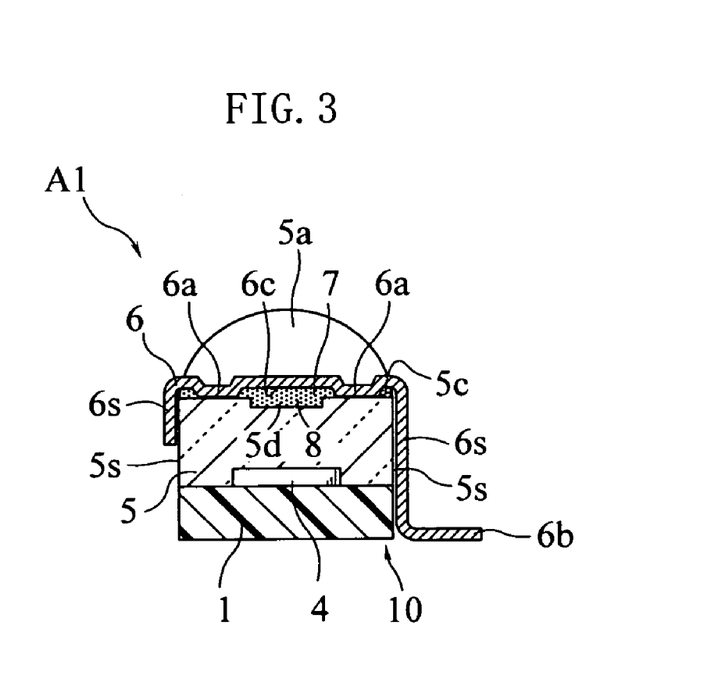
FIG. 3 is a vertical sectional view taken along lines III-III of FIG. 1.

FIGS. 1-3 illustrate an infrared communication module as an example of a semiconductor module according to a first embodiment of the present invention. FIG. 1 is a perspective view of the infrared communication module, FIG. 2 is a vertical sectional view taken along lines I-I of FIG. 1, and FIG. 3 is a vertical sectional view taken along lines II-II of FIG. 1.

The infrared communication module A1 is incorporated in e.g. portable personal computer (not shown) in use for two-way communication, and includes a semiconductor device 10 and a conductive cover 6. The semiconductor device 10 includes a base board 1, an LED 2, a photodiode 3, an IC chip 4, and a sealing resin 5.

The base board 1 is made of an insulating material such as glass epoxy resin, and is rectangular in plane. As shown in FIG. 2, the LED 2 for emitting infrared rays is mounted at one end (the right end in FIG. 2) of the base board 1. The photodiode 3 receives the infrared rays and generates current by generating photovoltaic power corresponding to the amount of the received infrared rays, and is mounted at the other end (the left end in FIG. 2) of the base board 1. The IC chip 4 controls the LED 2 to emit light based on a signal transmitted from a controller incorporated in the personal computer, converts the current generated by the photodiode 3 into an output signal to be transmitted to the controller of the personal computer, and is mounted about an intermediate portion in the longitudinal direction of the base board 1.

The sealing resin 5 is formed on the base board 1 by transfer mold method, using epoxy resin containing pigment. The sealing resin 5 seals the LED 2, photodiode 3, and the IC chip 4. The sealing resin 5 is visible-light-impermeable but sufficiently infrared-permeable.

The sealing resin 5 is provided with lenses 5a, 5b upwardly protruding above the LED 92 and the photodiode 93, respectively. The lens 5a improves the directivity of infrared rays emitted from the LED 2. The lens 5b collects infrared rays entering from outside onto a light receiving surface of the photodiode 3.

The upper surface of the sealing resin 5 is formed with a recess 5d. The recess 5d is, for example, formed by a tip end of an eject pin protruding from a mold by a minute dimension, while forming the sealing resin 5 by the transfer mold method. The recess 5d is utilized in coating of adhesive 8, as described below.

The conductive cover 6 is used as an electromagnetic shield for preventing electromagnetic wave generated by the LED 2 from leaking out of the infrared communication module A1 and for preventing electromagnetic wave, entering from outside of the infrared communication module A1, from influencing the IC chip 4. The conductive cover 6 is made by bending a metal thin plate to cover the upper surface and four side surfaces of the sealing resin 5 except the lenses 5a, 5b.

An upper plate 6u of the conductive cover 6 partly covers the upper surface 5c of the sealing resin 5, while side plates 6s of the conductive cover 6 partly cover the side surfaces 5s of the sealing resin 5. As described below, the conductive cover 6 is bonded to the sealing resin 5 using adhesive 8. At the bottom around the intermediate portion of one of the longitudinal side plates 6s, a terminal 6b for grounding protrudes outwardly. The terminal 6b is also formed by bending process. The terminal 6b is connected to a ground terminal of the personal computer.

As well shown in FIG. 1, the upper plate 6u of the conductive cover 6 is formed with four convex portions 6a protruding downwardly. The convex portions 6a are positioned, circumventing the recess 5d. As well shown in FIG. 2, the convex portions 6a are formed by embossing, and include lower-ends to be brought into contact with the upper surface 5c of the sealing resin 5. In this way, a gap 7 is formed between an under surface 6c of the conductive cover 6 except the convex portions 6a and the upper surface 5c of the sealing resin 5.

The adhesive 8 for bonding the conductive cover 6 to the sealing resin 5 is filled in the gap 7. In filling the adhesive 8, the adhesive 8 is mounded on the recess 5d, and the conductive cover 6 is pressed onto the sealing resin 5, so that the adhesive 8 is spread within the gap 7.

In the infrared communication module A1, the convex portions 6a contact the sealing resin 5 to form the gap 7. Thus, the adhesive 8 can be held within the gap 7, even if the adhesive 8 is spread by the under surface 6c of the conductive cover 6 facing the recess 5d when the conductive cover 6 is pressed onto the sealing resin 5 after filling the adhesive 7 in the recess 5d, in bonding the conductive cover 6 to the sealing resin 5. Therefore, the adhesive 8 is prevented from leaking out of the upper plate 6u of the conductive cover 6 to the lenses 95a and 95.

The above structure prevents the infrared communication module A1 from defacement. Further, as the adhesive 8 does not leak out to stick to the lenses 5a, 5b, the communication function of the infrared communication module A1 is prevented from being decreased due to a change in the traveling direction of the infrared rays emitted by the LED 2 because of the defaced lens 5a, or due to a change in the amount of the infrared rays collected by the photodiode 3 because of the defaced lens 5b.

As the four convex portions 6a of the conductive cover 6 are brought into contact with the upper surface 5c of the sealing resin 5c, the upper plate 6u is held in substantially parallel to the upper surface 5c of the sealing resin 5c. Thus, the upper plate 6u of the conductive cover 6 is prevented from being obliquely bonded to the upper surface 5c of the sealing resin 5.

As well shown in FIG. 3, the terminal 6b protrudes at a position substantially same as the position of the bottom of the base plate 10, when the upper plate 6u of the conductive cover 6 is duly held in substantially parallel to the upper surface 5c of the sealing resin 95. Thus, if the upper plate 6u is obliquely bonded to the upper surface 5c, the position of the terminal 6b may largely deviate away from a proper position. Such deviation causes improper grounding of the terminal 6b, so that the electromagnetic shielding effect of the conductive cover 6 may not be achieved.

However, as described above, the first embodiment provides a structure for preventing the conductive cover 6 from being obliquely bonded to the sealing resin 5 due to the non-uniform thickness of the adhesive 8. Thus, the terminal 6b of the conductive cover 6 is not deviated from a proper position in the infrared communication module A1, thereby properly achieving the electromagnetic shielding effect of the conductive cover 6.

Further, as the recess 5d is provided, the adhesive 8 can be provided more, for the capacity of the recess 5d, than in a case where such recess is not provided. Thus, the bonding strength between the conductive cover 6 and the sealing resin 5 is improved, thereby preventing the conductive cover 6 from being detached. Still further, the four convex portions 6a are positioned circumventing the recess 5d, so that no one of the convex portions 6a unduly gets into the recess 5d, thereby preventing the conductive cover 6 from obliquely bonded to the sealing resin 5.

Figure 4:
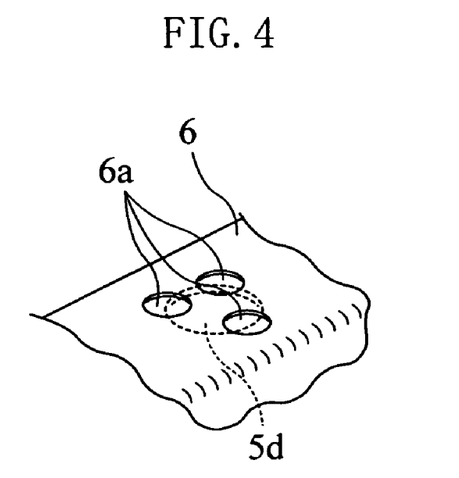
FIG. 4 is a perspective view illustrating the principal portion of an infrared communication module according to a second embodiment of the present invention.
Figure 5:
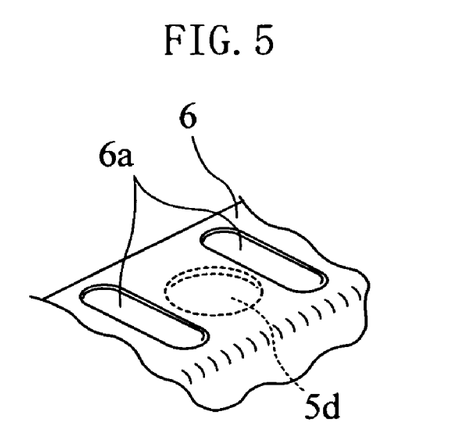
FIG. 5 is a perspective view illustrating the principal portion of an infrared communication module according to a third embodiment of the present invention.
Figure 6:
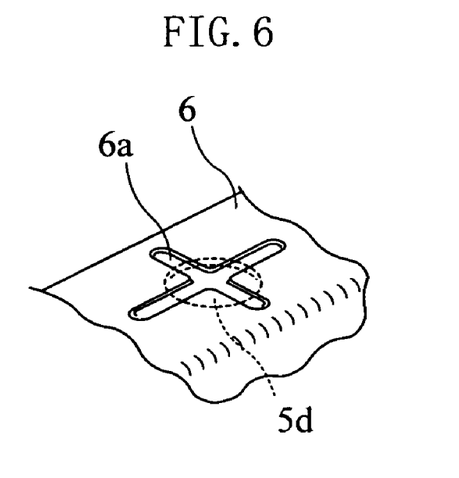
FIG. 6 is a perspective view illustrating the principal portion of an infrared communication module according to a fourth embodiment of the present invention.

FIGS. 4-6 illustrate infrared communication modules according to second to fourth embodiments of the present invention.

The infrared communication modules shown in FIGS. 4-6 are different from the infrared communication module according to the first embodiment, in the form, the number, and the position of the convex portions 6a of the conductive cover 6. In FIGS. 4-6, elements identical or common to those in the above embodiment are given the same reference numbers as the first embodiment. In the following description, only the different structures are to be described, and duplicated description will be omitted.

An infrared communication module according to second embodiment includes a conductive cover 6 formed with three convex portions 6a. Each of the convex portions 6a partly overlaps with the recess 5d of the sealing resin 5.

Specifically, the second embodiment differs from the first embodiment in that the number of the convex portions 6a of the conductive cover 6 is reduced to three, and these three convex portions 6a are arranged circumferentially on a circle smaller than a circle on which the four convex portions 6a of the first embodiment are positioned. In this way, the three convex portions 6a are arranged more inwardly than in the first embodiment, and thus each of the convex portions 6a partly overlaps with the recess 5d of the sealing resin 5.

Even when a part of each of the convex portion 6a overlaps the recess 5d, the other part of the convex portion contacts the upper surface of the sealing resin (not shown). Therefore, the convex portion 6a is prevented from getting into the recess 5d, and thus the conductive cover 6 is prevented from obliquely bonded to the sealing resin 5 also in the second embodiment.

The diameter of the recess 5d may be reduced so that the convex portions 6a do not overlap with the recess 5d of the sealing resin 5.

In the infrared communication module according to the second embodiment, the three convex portions 6a are positioned at a space smaller than in the first embodiment. Thus, even if the size of the upper plate 6u of the conductor cover 6 is reduced for downsizing of the infrared communication module, the advantages can be obtained such as preventing defacement of the lenses 5a, 5b and decrease in the communication function of the infrared communication module A1 due to the adhesive 8 leaking out of the conductive cover 6 to be bonded to the sealing resin 5, and preventing decrease in the electromagnetic shielding effect of the conductive cover 6 due to the deviated terminal 6b.

As seen from the second embodiment, the three convex portions 6a are arranged non-linearly, specifically, are arranged to form a triangle, for preventing the conductive cover 6 from being obliquely bonded.

As shown in FIG. 5, an infrared communication module according to third embodiment includes two elongated convex portions 6a, in place of the four convex portions 6a of the first embodiment. The center axes of the two convex portions 6a are parallel to each other, but not collinear. Specifically, the two convex portions 6a are respectively arranged at a space sandwiched by the recess 5d and the lens 5a and at a space sandwiched by the recess 5d and the lens 5b.

In the third embodiment, as the number of the convex portions 6a is reduced, e.g. a mold for forming the convex portions can be simplified. The number of the convex portions 6a in the third embodiment is half the number of the convex portions 6a in the first embodiment, and as may be seen from comparison between FIGS. 1 and 5, each of the convex portions 6a of the third embodiment is an elongated combination of two of the circular convex portions 6a arranged widthwise of the conductive cover in the first embodiment. Therefore, the convex portions 6a contact the upper surface 5c of the sealing resin 5, to obtain no less effect than the first embodiment.

In this way, the third embodiment also provides effects similar to the above-described effects of the first embodiment.

In FIG. 5, the two convex portions 6a are elongated widthwise of the upper plate 6u of the conductive cover 6, however, the two convex portions 6a may be elongated longitudinally of the upper plate 6u of the conductive cover 6.

As shown in FIG. 6, an infrared communication module of a fourth embodiment includes a conductive cover 6 formed with a substantially cross-shaped convex portion 6a. The convex portion 6a shown in FIG. 6 is substantially identical to a crossed-shaped convex portion 6a made of two combinations, each including two diagonally opposite convex portions out of four convex portions 6a shown in FIG. 1. Thus, in the fourth embodiment, the cross-shaped convex portion 6a contacts the upper surface 5c of the sealing resin 5, to obtain no less effect than the first embodiment. Therefore, the fourth embodiment also provides effects similar to the above-described effects of the first embodiment.

Further, when the size of the convex portion 6a is sufficiently large relative to the recess 5d, even if the position of the recess 5d is somewhat altered, the convex portion 6a may not get into the recess 5d. This ensures that the convex portion 6a partly contacts a portion other than the recess 5d, thereby properly bonding the conductive cover 6.

Figure 7:
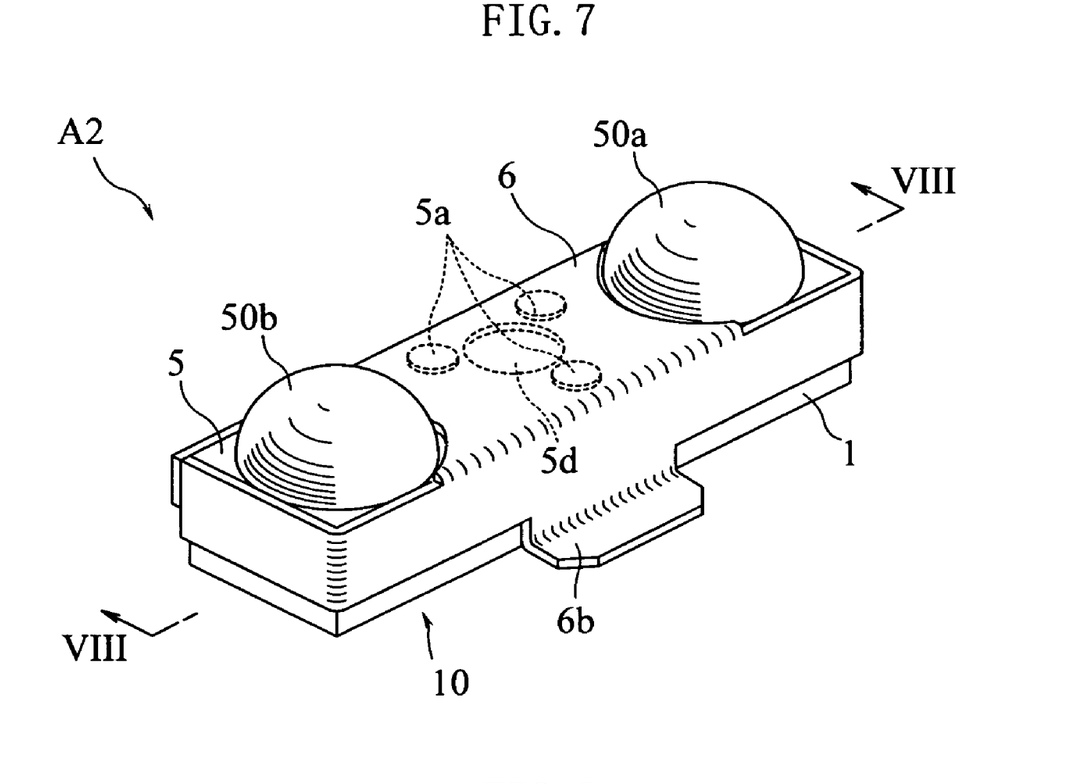
FIG. 7 is a perspective view illustrating the principal portion of an infrared communication module according to a fifth embodiment of the present invention.
Figure 8:
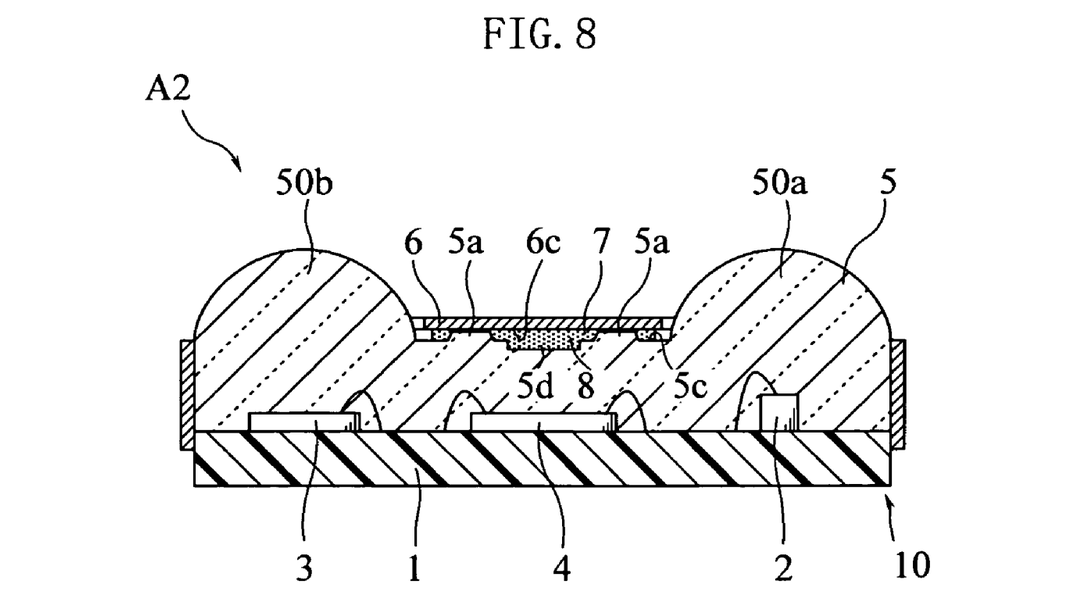
FIG. 8 is a sectional view taken along lines VIII-VIII of FIG. 7.

FIGS. 7 and 8 illustrate an infrared communication module according to a fifth embodiment of the present invention. The infrared communication module A2 according to the fifth embodiment differs from the infrared communication module A1 according to first through fourth embodiments in that three convex portions 5a are formed on the upper surface of the sealing resin 5.

As well shown in FIG. 8, the three convex portions 5a contact the under surface 6c of the conductive cover 6, and the portion surrounded by these convex portions 5a and the recess 5d provides a space 7 for filling in the adhesive 8.

Equally to the above-described infrared communication module A1, the infrared communication module A2 according to the fifth embodiment prevents the adhesive 8 from leaking and also prevents the conductive cover 6 from obliquely bonded to the sealing resin. When the sealing resin 5 is made by the transfer mold method, the three convex portions 5a may be formed in the molding process of the sealing resin 5, without any additional process for forming the three convex portions 5a. The convex portions of the present invention may be formed not only on the sealing resin 5, but at the other portions of the semiconductor device.

Figure 9:
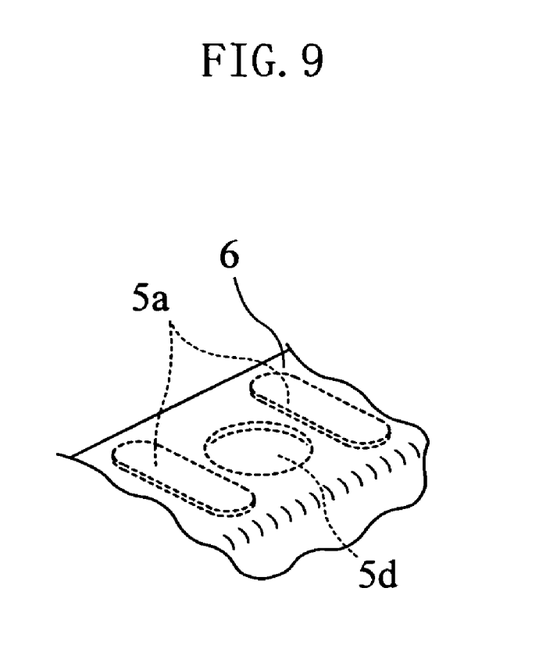
FIG. 9 is a perspective view illustrating the principal portion of an infrared communication module according to a sixth embodiment of the present invention.

FIG. 9 illustrates an infrared communication module according to a sixth embodiment. When the sealing resin 5 is formed with the convex portions 5a, similarly to the convex portions 6a of the conductive cover 6, the form, the number, and the position of the convex portions 5a may be modified variously. For example, the infrared communication module according to the sixth embodiment includes two elongated convex portions 5a.

The semiconductor device according to the present invention is not limited to the above embodiment, but may be modified variously.

For example, the convex portions of the conductive cover are not limited to be formed by embossing, but may be provided by bonding a metal piece molded into a predetermined form, for example. Further, each of the conductive cover and the semiconductor device may be provided with a respective convex portion, and may be positioned so that the convex portions face to each other.

The conductive cover and the semiconductor device is not limited to be bonded at the upper plate 6u of the conductive cover 6 and the upper surface 5c of the sealing resin 5 as shown in FIGS. 2 and 3. For example, one of the side surfaces 5s of the sealing resin 5 may be formed with a recess 5d, while corresponding one of the side surfaces 6s of the conductive cover 6 may be formed with a convex portion 6a, thereby bonding these side surfaces. The recess formed at the sealing resin is favorable for filling a large amount of adhesive, however, the present invention is not limited to this and such recess may be omitted. Further, the conductive cover is not limited to be bonded to the sealing resin, but may be bonded to a portion other than the sealing resin, such as the base board.

The semiconductor module according to the present invention is not limited to the infrared communication module capable of two-way communication. The present invention may be applied to an infrared ray emitting module having an infrared-ray emitting element and an IC chip, and may also be applied to an infrared-ray receiving module having an infrared ray receiving element and an IC chip. Further, the present invention may be applied to a module capable of emitting or receiving visible light other than infrared rays. Still further, the semiconductor module according to the present invention is not limited to be used for communication between personal computers, but may be incorporated in various devices such as a remote controller of an electronic device or a mobile phone, for example. The present invention may be widely applied to a semiconductor module provided with a semiconductor device having a semiconductor chip, and with a conductive cover used for electromagnetic shielding of the semiconductor device.

The invention claimed is:

1. A semiconductor module comprising:
    a semiconductor device provided with a semiconductor chip; and
    a conductive cover for electromagnetic shielding bonded to the semiconductor device via an adhesive coat;
    wherein the conductive cover includes a surface facing the adhesive coat, the surface being formed with a convex portion protruding toward the adhesive coat;
    wherein around the convex portion, a space is formed for filling in adhesive to form the adhesive coat;
    wherein the semiconductor device includes a surface facing the adhesive coat, the surface being formed with a recess; and
    wherein at least a part of the convex portion is positioned on a portion other than the recess.

2. The semiconductor module according to claim 1, comprising three or more convex portions arranged nonlinearly.

3. The semiconductor module according to claim 1, comprising two or more elongated convex portions having center axes non-collinear to each other.

4. The semiconductor module according to claim 1, wherein the conductive cover is made of a metal, and the convex portion is formed by embossing.

5. The semiconductor module according to claim 1,
    wherein the semiconductor device includes a light emitting element capable of generating infrared rays, a light receiving element capable of receiving and detecting infrared rays, and an IC chip,
    wherein the semiconductor module is an infrared communication module capable of transmitting and receiving infrared rays.

6. A semiconductor module comprising:
    a semiconductor device provided with a semiconductor chip; and
    a conductive cover for electromagnetic shielding bonded to the semiconductor device via an adhesive coat;
    wherein the semiconductor device includes a surface facing the adhesive coat, the surface being formed with a convex portion protruding toward the adhesive coat,
    wherein around the convex portion, a space is formed for filling in adhesive to form the adhesive coat;
    wherein the semiconductor device includes a surface facing the adhesive coat, the surface being formed with a recess; and
    wherein at least a part of the convex portion is positioned on a portion other than the recess.

* * * * *